(12) United States Patent
Lesser et al.

(10) Patent No.: US 11,016,145 B1
(45) Date of Patent: May 25, 2021

(54) FAULT TEST CIRCUIT USING LAUNCH-OFF-SHIFT SCAN

(71) Applicant: Allegro MicroSystems, LLC, Manchester, NH (US)

(72) Inventors: Ignacio Lesser, Buenos Aires (AR); Nicolas Rigoni, Buenos Aires (AR); Octavio H. Alpago, Ciudad de Buenos Aires (AR); Lautaro Casella, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/720,531

(22) Filed: Dec. 19, 2019

(51) Int. Cl.
*G01R 31/3177* (2006.01)
*G01R 31/317* (2006.01)

(52) U.S. Cl.
CPC ... *G01R 31/3177* (2013.01); *G01R 31/31701* (2013.01); *G01R 31/31724* (2013.01); *G01R 31/31727* (2013.01)

(58) Field of Classification Search
CPC .......... G01R 31/3177; G01R 31/31701; G01R 31/31724; G01R 31/31727
See application file for complete search history.

(56) References Cited

U.S. PATENT DOCUMENTS

| | | | |
|---|---|---|---|
| 7,444,567 B2 * | 10/2008 | Wang | G01R 31/318586 714/726 |
| 7,694,200 B2 | 4/2010 | Forrest et al. | |
| 7,800,389 B2 | 9/2010 | Friedrich et al. | |
| 8,447,556 B2 | 5/2013 | Friedrich et al. | |
| 9,513,337 B2 | 12/2016 | Forrest et al. | |
| 2007/0288796 A1 * | 12/2007 | Whetsel | G01R 31/3177 714/30 |
| 2009/0106608 A1 * | 4/2009 | Grise | G01R 31/318594 714/726 |
| 2011/0099442 A1 * | 4/2011 | Hales | G01R 31/318533 714/729 |
| 2018/0031631 A1 * | 2/2018 | Srinivasan | G01R 31/318541 |
| 2018/0307553 A1 * | 10/2018 | Acharya | G06F 11/0757 |

OTHER PUBLICATIONS

Zhuang et al., System level LBIST implementation, IEEE, p. 263. (Year: 2008).*

(Continued)

*Primary Examiner* — Shelly A Chase

(74) *Attorney, Agent, or Firm* — Daly, Crowley, Mofford & Durkee, LLP

(57) ABSTRACT

An integrated circuit sensor can have a test program generator that is configured to receive a portion of a scan vector, where the scan vector includes a test mode signal and a scan enable signal. The test program generator is configured to retrieve a launch-off-capture test sequence from the scan vector and use the launch-off-capture test sequence and the test mode signal to generate a launch-off-capture test signal. A test signal generator is configured to generate a launch-off-shift test signal using the launch-off-capture test signal and the scan enable signal. A built-in self-test circuit is configured to test the integrated circuit sensor using the launch-off-shift test signal.

23 Claims, 6 Drawing Sheets

(56) References Cited

OTHER PUBLICATIONS

Wang et al., Using launch on capture for testing BIST designs containing synchronous and asynchronous clock domains, IEEE, pp. 299-312. (Year: 2010).*

Ahmed et al., Enhanced launch off capture transition fault testing, IEEE, pp. 1 to 10. (Year: 2005).*

Ahmed, et al.; "Improving Transition Delay Fault Coverage Using Hybrid Scan-Based Technique"; Proceedings of the 2005 $20^{th}$ IEEE International Symposium on Defect and Fault Tolerance in VLSI Systems; Nov. 2005; 10 Pages.

Park, et al.; "Launch-on-Shift-Capture Transition Tests"; International Test Conference; Paper 35.3; 2008; 9 Pages.

* cited by examiner

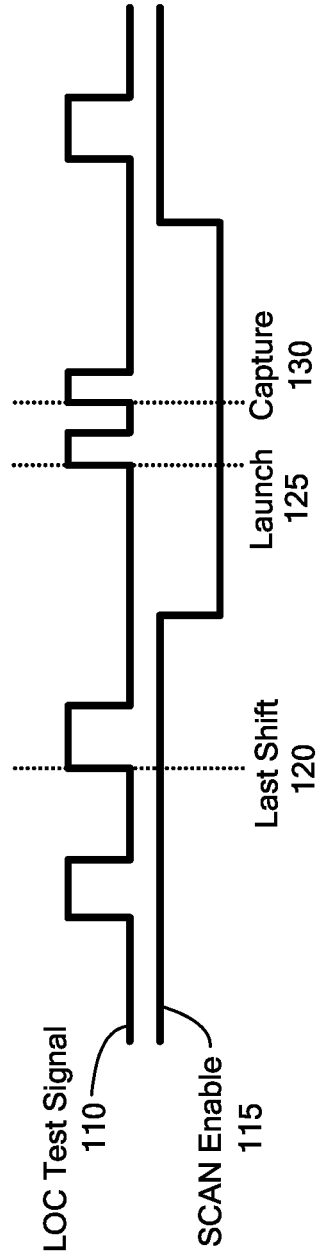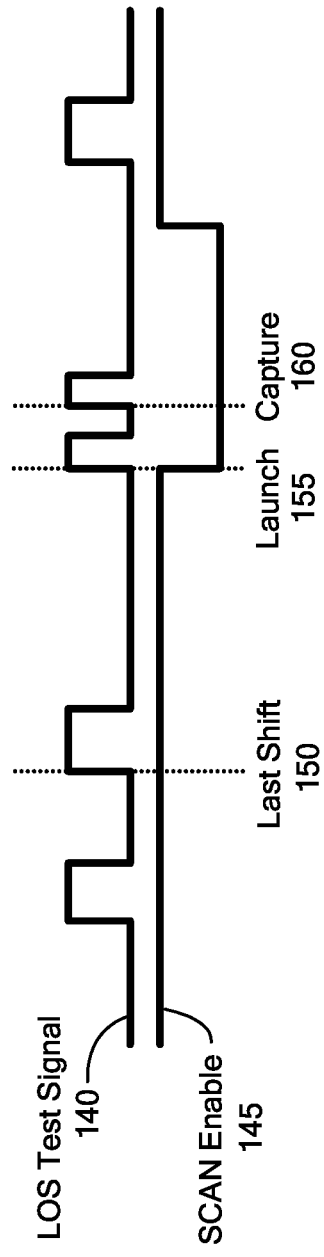

FAULT TEST CIRCUIT USING LAUNCH-OFF-SHIFT SCAN

BACKGROUND

As digital semiconductor Integrated. Circuit (IC) geometries become smaller and as signal speeds become faster, fault testing becomes more challenging. Various fault conditions such as marginal contacts, marginal vias and marginal interconnects can cause signal delay faults. Test sequences used in fault testing are becoming larger and more complicated because of the increase in IC complexity and size. Existing test hardware may not be able to handle these large, complicated test sequences.

Automatic Test Equipment (ATE) can be used to generate test signals to exercise the digital IC and the resulting IC generated signals may be analyzed by the ATE and/or another external controller. ICs tend to be configured to enable design for testability (INT) solutions that can be used to detect fabrication failures at an early point in the manufacturing process. Examples of these DFT solutions are scan tests (SCAN) and logic built-in self-tests (LBIST) which can be used separately or together depending on the size of the IC, the pin count of the IC or the application use for the IC (larger ICs typically include both SCAN and LBIST). The ATE together with INT solutions can be used to test circuits, surfaces and other aspects of an IC, sometimes referred to as a Device Under Test (DUT).

Launch-off-capture is a technique that can be used to generate test patterns or signals for SCAN and LBIST to test an IC for delays. As ICs have become larger in size and more complex, the test signals have become larger and contain a larger number of test sequences. Existing test hardware may not be able to handle increasingly larger test signals associated with launch-off-capture test signal generation techniques.

SUMMARY

Described herein is an integrated circuit sensor that includes a test program generator that can be configured to receive a portion of a scan vector that includes a test mode signal and a scan enable signal. The test program generator can be configured to retrieve a launch-off-capture test sequence from the scan vector and generate a launch-off-capture test signal using the launch-off-capture test sequence and the test mode signal. Included is a test clock signal generator that can be configured to generate a launch-off-shift test signal using the launch-off-capture test signal and the scan enable signal. Also included is a built-in self-test circuit that can be configured to test the integrated circuit sensor using the launch-off-shift test signal.

The integrated circuit sensor can include an oscillator that is configured to generate a master clock signal. The test program generator can be configured to generate a launch-off-capture test signal using the launch-off-capture test sequence, the test mode signal and the master clock signal.

The test program generator can receive the scan vector from external test equipment. The scan vector can include one or more test sequences and one or more expected test results. The test clock signal generator can be configured to receive the scan vector.

The test clock signal generator can include a flip flop and an OR gate. The OR gate can be configured to shift the launch-off-capture test signal to generate the launch-off-shift test signal.

Also described is a method for testing an integrated circuit sensor that includes receiving a scan vector that includes a test mode signal, a scan enable signal and a launch-off-capture test sequence. The method includes generating a launch-off-capture test signal using the test mode signal and the launch-off-capture test sequence and generating a launch-off-shift test signal using the launch-off-capture test signal and the scan enable signal. The method also includes testing the integrated circuit sensor using the launch-off-shift test signal. In some instances, the method can also include receiving test results generated by a digital core of the integrated circuit sensor in response to the launch-off-shift test signal, wherein the test results are associated with a launch-off-shift test mode.

Also described is an integrated circuit sensor that includes means for receiving a scan vector that includes a test mode signal, a scan enable signal and a launch-off-capture test sequence. The integrated circuit sensor includes means for generating a launch-off-capture test signal using the test mode signal and the launch-off-capture test sequence and means for generating a launch-off-shift test signal using the launch-off-capture test signal and the scan enable signal. The integrated circuit sensor includes means for testing the integrated circuit sensor using the launch-off-shift test signal.

BRIEF DESCRIPTION OF THE DRAWINGS

The foregoing and other objects, features and advantages will be apparent from the following more particular description of the embodiments and the appended claims, as illustrated in the accompanying drawings in which like reference characters refer to the same parts throughout the detailed description. Reference characters introduced in a figure may be repeated in one or more subsequent figures without additional description in the detailed description in order to provide context for other features of the described embodiments.

FIG. 2A shows example waveforms generated during a launch-off-capture test;

FIG. 2B shows example waveforms generated during a launch-off-shift test;

DETAILED DESCRIPTION

Figure 1:
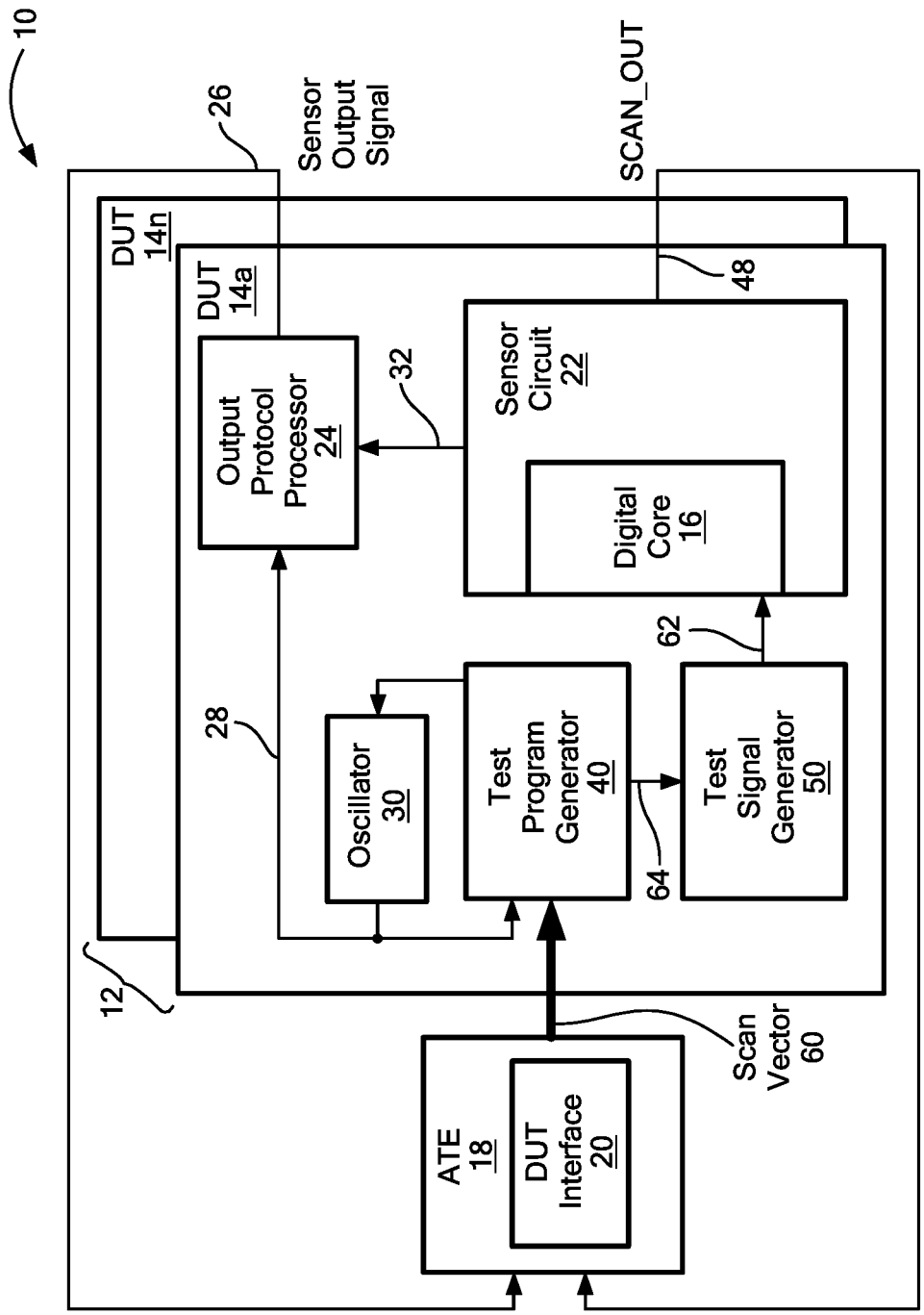
FIG. 1 is a block diagram of a test system for testing one or more devices.

FIG. 1 illustrates a test system 10 for testing one or more electronic circuit devices, or Devices Under Test (DUTs) 14*a*-14*n*, as shown. The DUTs 14*a*-14*n* may take the form of semiconductor ICs or ASICs and may be used in a variety of applications. Each DUT 14*a*-14*n* can include a digital core 16 that includes circuitry for performing fault testing on the DUT 14*a*-14*n*. Fault testing may be performed during a stage of manufacture when a semiconductor wafer 12 supports the DUTs 14*a*-14*n* (i.e., wafer level testing). An Automatic Test Equipment (ATE) unit 18 including a DUT interface 20 can be coupled to the wafer 12 to perform fault testing. Testing can also be performed on each individual DUT 14*a*-14*n* after the wafer is diced and the DUTs are individually packaged in which case the ATE 18 can be coupled to each individual DUT 14a.

The ATE unit 18 can generate test signals such as one or more clock signals, scan vectors, test vectors, test signals or patterns which are data streams tailored to test specific IC functions and/or signal paths, referred to generally as Automatic Test Pattern Generation (ATPG). Clock signals generated by the ATE can include a launch pulse, a scan pulse, and a capture pulse that have a close and precise timing relationship, such as a spacing on the order of 100 nanoseconds.

Each DUT 14a-14n, also referred to herein as the sensor integrated circuit (IC) 14a, can include a sensor circuit 22 coupled to an output protocol processor 24 which outputs a sensor output signal 26. The sensor circuit 22 can include one or more magnetic field transducers, such as one or more Hall effect device(s), and the sensor output signal 26 can indicate one or more characteristics of a target (e.g., a ferromagnetic target) that is proximate to the sensor IC 14a in its operational environment. Illustrative sensed characteristics include current, speed, angle, linear position, and rotational direction. Furthermore, the sensor circuit 22 may sense other types of characteristics such as temperature, pressure, etc. Other types of magnetic field sensing elements, such as magnetoresistive elements (for example a giant magnetoresistance (GMR) element, an anisotropic magnetoresistance element (AMR), a tunneling magnetoresistance (TMR) element, an Indium antimonide (InSb) sensor, a Gallium Arsenide (GaAs) sensor, and magnetic tunnel junction (MTJ) devices) are also suitable. The sensor circuit 22 may be a single ended or differential arrangement including one or more sensing elements in various known configurations.

In one embodiment, the sensor IC 14a can be a gear tooth sensor for an automotive application, such as for fuel injection, anti-lock braking, or power steering applications, in which case the sensor circuit 22 may include a plurality of magnetic field sensing devices for sensing a speed of rotation and/or a direction of rotation of a ferromagnetic gear.

The output protocol processor 24 can be responsive to a master clock signal 28 for providing the sensor output signal 26. In one embodiment, the sensor IC 14a senses a speed of rotation and a direction of rotation of a gear and provides this information 32 (i.e. the sensed speed and direction) to the output protocol processor 24. Responsive to receiving this speed and direction information 32, the output protocol processor 24 generates and outputs a sensor output signal 26 with pulses of a frequency proportional to the speed of rotation of the gear and a pulse width indicative of the direction of rotation of the gear. For example, a fifty (50) microsecond wide pulse may indicate a clockwise rotation, while a one-hundred (100) microsecond pulse may indicate counterclockwise rotation.

The sensor IC 14a can include an oscillator 30 for generating the master clock signal 28. The oscillator 30 can generate the master clock signal 28 according to timing information provided by a test program generator 40 to the oscillator 30. In some instances, the master clock signal 28 can be trimmed in response to a trim signal for the purpose of calibrating and verifying the master clock signal and thus, the resulting sensor output signal 26 according to precise application driven specifications. During manufacture, the master clock signal 28 can be monitored so that its pulse width can be adjusted to satisfy particular output protocol specifications. While FIG. 1 illustrates an oscillator 30 residing outside of the test program generator 40, in other embodiments the oscillator 30 can reside within the test program generator 40.

Also included in the sensor IC 14a can be a test program generator 40 and a test clock signal generator or simply test signal generator 50. The test program generator 40 can respond to the master clock signal 28 and the ATE-generated signals 60 by issuing test signals 64 to the test signal generator 50. The ATE-generated input signals 60 can include various test clock options, a test enable signal, a test vector data signal, or a programming signal.

The test program generator 40 can be responsive to the ATE 18 to provide a test signal 64 or data signals to the test signal generator 50. In some instances, these test signals 64 can be a launch-off-capture test signal 64. In response, the test signal generator 50 can generate a modified or formatted test signal 62 that it issues to the digital core 16. In some instances, this modified test signal 62 can be a launch-off-shift test signal 62. During testing, the digital core 16 can be exercised using the modified test signals 62.

An output signal of the digital core 16, SCAN_OUT, 48 can be fed back to the ATE 18 or to another controller for evaluation of the sensor's response to test signals.

The sensor IC 14a can have one or more circuits that are configured to provide logic built-in self-test (LBIST) capabilities. In some instances, these LBIST capabilities can reside in the digital core 16. For LBIST tests, the test vectors and the scan related signals are generated internally (e.g., input vectors are created using pseudo random patterns) instead of being delivered by the ATE. LBIST capabilities can implement integrated circuit scan tests, also referred to as SCAN techniques. These SCAN techniques can use launch-off-shift (LOS) test sequence or launch-off-capture (LOC) test sequence to instigate a fault during testing. FIG. 2A shows example waveforms generated while carrying out a SCAN test that uses a launch-off-capture (LOC) test sequence, while FIG. 2B shows example waveforms generated while carrying out a SCAN test that uses a launch-off-shift (LOS) test sequence.

It is well-known to use a launch-off-capture (LOC) test sequence to generate delay test signals for testing an integrated circuit by mimicking a fault in the IC circuitry. The waveforms illustrated in FIG. 2A are part of a LOC test sequence that includes a LOC test signal 110 and a SCAN enable signal 115. In a LOC test technique, the SCAN enable signal 115 together with a master clock signal (not shown) can be used to generate a LOC test signal 110. This LOC test signal 110 contains a delay fault value that can be used to provide stimulus to a fault site (i.e., a portion of the IC circuitry) to mimic a delay fault. The logic values used to generate the LOC test signal 110 are back-tracked through one level of functional logic (e.g., a flip flop) such that when the master clock pulses on the last shift 120, the flip flop in the scan chain that provides the delay logic value (i.e., stimulus) creates the transition from an initial fault value to a final fault value at the fault site. In this LOC test sequence, the transition from the initial fault value to the final fault value is launched by the flip flops at launch 125, and the observed result generated by the IC is output at capture 130 or when the master clock pulse releases.

Unlike the LOC test sequence, the launch-off-shift (LOS) test sequence does not require back-tracking through a level of functional logic and therefore less time is required to carry out the test sequence, less time is required to compute the test signals, and a lower vector count is required to carry out the test sequence. These reductions in time and vector count translate into reduced testing costs. Additionally, by eliminating the need to back-track through a level of functional logic, the LOS test techniques can directly issue stimulus or fault values to a fault site and therefore test an increasingly larger number of fault sites.

Figure 3A:
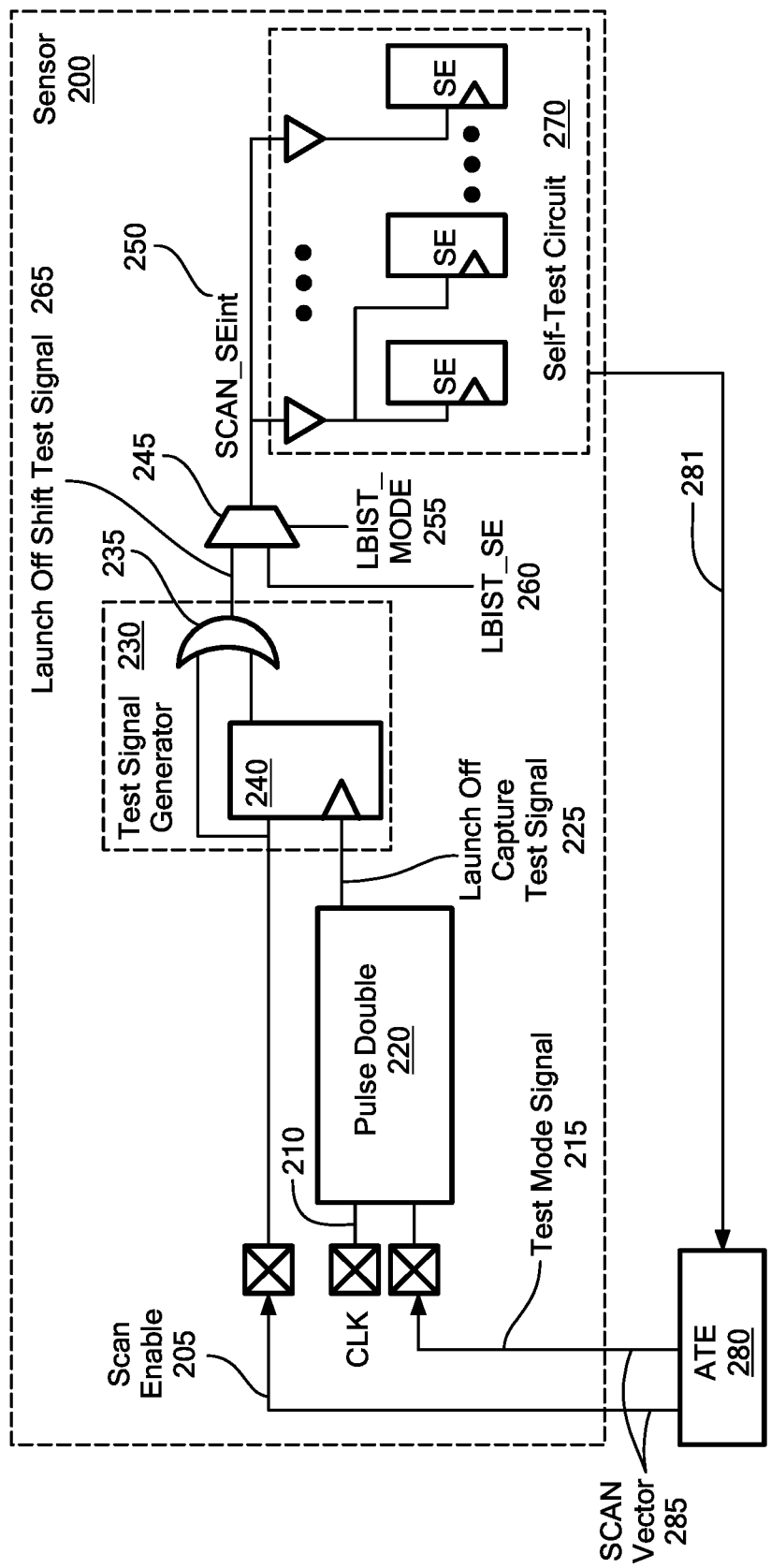
FIG. 3A is a block diagram of aspects of an integrated circuit sensor with built-in self-testing circuitry.
Figure 3B:
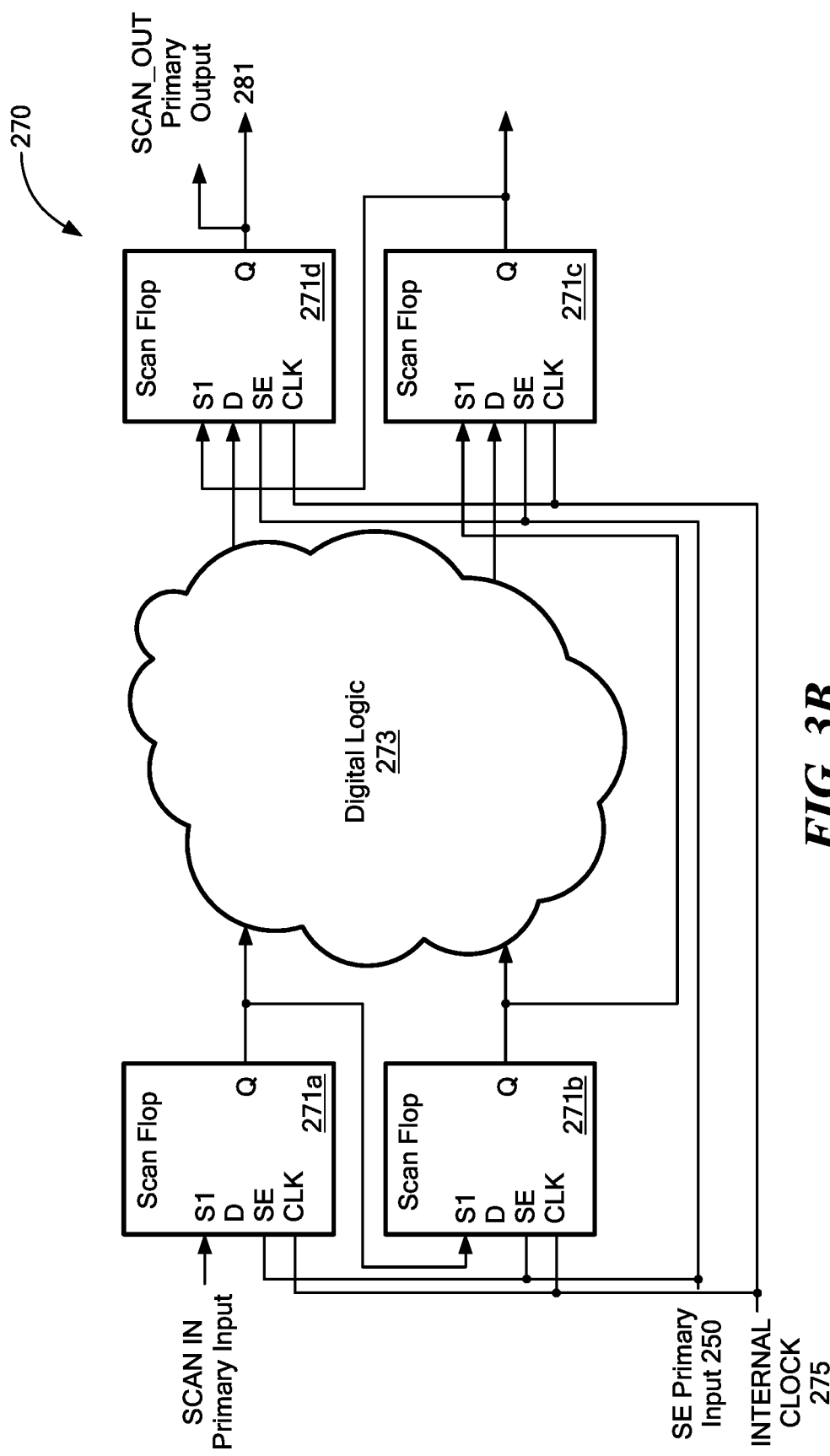
FIGS. 3B-C are block diagrams of aspects of a self-test circuit.

The waveforms illustrated in FIG. 2B are part of a LOS test sequence that includes a LOS test signal 140 and a SCAN enable signal 145. The LOS test sequence loads logic values from the LOS test signal 140 and uses these logic values to cause an initial fault value in the scan chain which includes multiple scan cells. A scan chain, such as the scan chain illustrated in FIG. 3B, is a series of flip flops or other logic elements that provide logic test points within the IC. Instigating a logical value change at these logic test points provides a stimulus to the sites within the IC to mimic a fault at those sites. The IC's response to the stimulus can be observed at each flip flop and recorded or otherwise relayed back to an ATE 18 to determine whether an error occurred.

The logic values needed to cause a fault are loaded into scan chains and the logic values are shifted backward one bit position along the scan chains, within the test signal and toward an initial logic value (i.e., toward the scan-in primary input). The transition fault effect is created by performing a final shift operation backward, switching the scan enable pin from the scan state to the functional state, and generating a high speed capture pulse. In a LOS test sequence, the scan enable pin is switched in the middle of the high speed sequence of clock pulses so that the fault effect value can be captured from functional logic. LOS also requires that the scan enable is capable of switching at a functional speed and that the tree of logic which feeds the scan enable signal to all of the flip flops in the IC is a well-balanced tree from a timing perspective. Implementing a LOS test by modifying the existing testing equipment and software can require additional design effort and manufacturing costs that increase the overall cost of the sensor IC.

A LOS SCAN technique can be implemented within existing IC chip architectures by leveraging existing LBIST capabilities and LOC software and circuits, and providing the additional circuitry needed to implement the LOS test sequence. Illustrated in FIG. 3A is a diagram of a sensor 200 that leverages existing LBIST capabilities to implement launch-off-shift-based testing. The sensor 200 interfaces with an Automatic Test Equipment unit ("ATE") 280 that provides a scan vector 285 to the sensor 200 and receives feedback 281 from the sensor 200.

The scan vector 285 can include multiple signals or vectors. In particular, the scan vector 285 can include a test sequence (not shown), expected test results (not shown), a test mode signal 215 and a scan enable signal 205. The relationship between the scan enable signal 205 and the test mode signal 215 dictates whether testing occurs according to a launch-off-capture (LOC) or launch-off-shift (LOS) test sequence. The scan enable 205 signal can be referred to as a shift enable signal and is used to control flip flops in a scan chain to scan-in a logical test value or sequence of logical test values. The master clock signal 210 is provided by an oscillator (not shown) in the sensor 200 and is used along with the test mode signal 215 to determine when to assert the scan enable signal 205 by causing the scan enable signal 205 to go high. For example, the scan enable signal 205 can switch from a low logical value (zero) to a high logical value (one). Asserting the scan enable signal 205 causes flip flops or other logic elements within the sensor 200 to scan-in logical test values according to a LOC or LOS test sequence.

The sensor 200 includes a pulse double circuit 220 that receives the test mode signal 215 and the master clock signal 210 and uses both signals to generate a clock signal 225 for flip flops in a scan chain. The clock signal 225 generated by the pulse double circuit 220 can be used when the sensor 200 is operating and when the sensor 200 is in a test mode and thus, signal 225 can be referred to as a test signal. Depending on the value of the scan enable signal 205, the test signal 225 can switch between the test mode signal 215 and the master clock signal 210. For example, when the scan enable signal 205 is high, the clock signal 225 mimics the test mode signal 215 such that the clock signal is the test mode signal 215. When the scan enable signal 205 is low, the pulse double circuit 220 outputs a clock signal 225 with two consecutive clock pulses when a test mode signal 215 is received. The pulse double circuit 220 therefore generates the test program based in part on the test mode signal 215 and the master clock signal 210. Thus, the pulse double circuit 220 has several functions including feeding the clock input of all scannable flip flops, switching between the internal clock (i.e., signal 210) and the external scan clock (i.e., signal 215) depending on the scan enable signal 205, and when performing a delay fault scan generating back-to-back pulses at the rate of clock signal 210 when the shift enable signal 205 is low. For LBIST testing mode, the scan clock is not used and so, the output of the pulse double circuit is provided by the internal clock signal 210 (or a divided version of the internal clock signal 210 in order to minimize power consumption). In the functional mode of IC operation, the output of the pulse double circuit 220 is provided by the internal clock signal 210.

The clock signal 225 output by the pulse double circuit 220 is a launch-off-capture (LOC) test signal 225 that can have characteristics similar to or the same as LOC signal 110 (FIG. 2A). According to the disclosure, using circuitry in the test signal generator 230, the LOC test signal 225 can be converted to a LOS test signal 265.

The pulse double circuit 220 also generates a clock signal for circuits within the self-test circuit 270. As shown in FIG. 3B, the self-test circuit 270 includes one or more flip flops 271*a-d* that receive an internal clock signal 275 that can be generated by the pulse double circuit 220. This internal clock signal 275 can be the same as the clock signal 210 of FIG. 3A. When in self-test mode, the LOC test signal 225 switches between the clock signal 210 and the test mode signal 215 depending on the scan enable signal 205. When the scan enable signal 205 is high, the LOC test signal can be the test mode signal 215, and when the scan enable signal 205 is low, two consecutive clock signal 210 pulses are generated when the test mode signal 215 is received.

Included in the test signal generator 230 is a flip flop 240 and an OR gate 235. The test signal generator 230 receives the scan enable signal 205 from the ATE 280 and the LOC test signal 225 generated by pulse double circuit 220 and uses both signals to generate a launch-off-shift (LOS) test signal 265. Generating the LOS test signal 265 requires controlling the overlap between the scan enable signal 205 and the LOC test signal 225 to shift the LOC test signal 225 to generate a LOS test signal 265. The test signal generator 230 tracks the scan enable signal 205 and shifts the scan enable signal 205 one or more clock pulses which in turn shifts the LOC test signal 225 to generate a LOS test signal 265. Shifting the scan enable signal 205 relaxes the test sequence provided in the scan vector 285 and permits testing using LOS.

Figure 4:
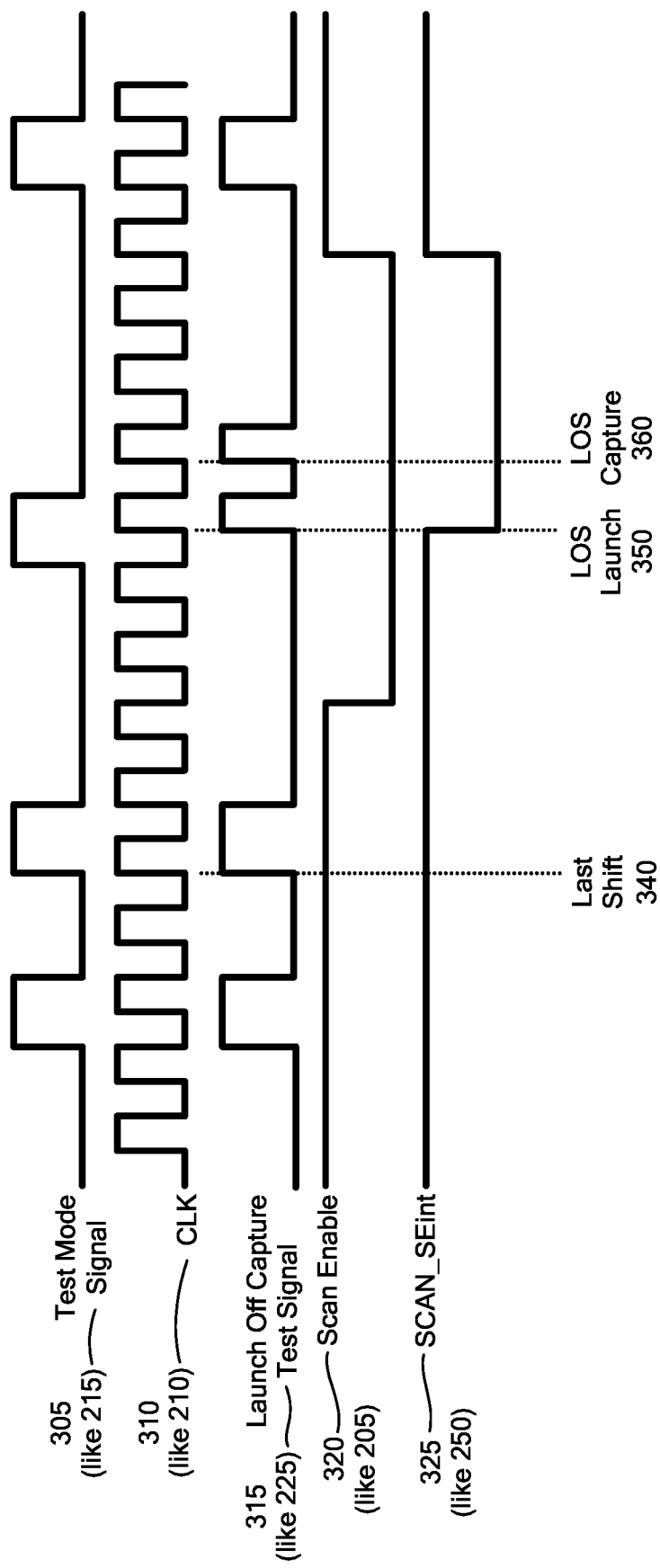
FIG. 4 shows example waveforms associated with testing the integrated circuit sensor illustrated in FIG. 3A.

In particular, the LOS test signal can be generated by setting the SCAN_SEint 250 (325 in FIG. 4) signal low with the rising edge of the clock signal 210 (310 in FIG. 4) at launch, where launch is determined in part from the LOC test signal 225 (315 in FIG. 4). When the last shift pulse 340 occurs (FIG. 4), the test signal generator 230 sets its output high because the scan enable signal 205 is high. The OR gate 235 ORs the scan enable signal with the flip flop 240 output, where the output of the OR gate 235 remains high after the scan enable signal 205 goes low and remains high until a new pulse from the clock signal 210 generated by the pulse double circuit 220 occurs. The LOC test signal 225 depends from the scan enable 205 value, therefore when the scan enable 205 value goes low, the pulse double circuit 220 outputs a LOC test signal 225 that switches from the scan enable signal 205 to the clock signal 210. The SCAN_SEint 250 signal remains high after the scan enable signal 205 is low and remains high until the next LOC test signal 225 pulse occurs. By permitting SCAN_SEint 250 to remain high, proper timing between the SCAN_SEint 250 and the test mode signal 215 can be achieved. While in the scan mode, the output of flip flop 240 and the output of OR gate 235 (i.e., LOS test signal 265) match each other. Also the LBIST_MODE signal 255 is low during the scan mode. This LBIST_MODE signal is set high only in LBIST mode (when the scan signals are generated internally). And since the LBIST_MODE signal 255 is low during the scan mode, the value of the LBIST_SE signal 260 is irrelevant since the multiplexer 245 selects signal 265 to provide as the SCAN_SEint signal 250 during the scan mode.

Illustrated in FIG. 4 are waveforms demonstrating the various signals of FIG. 3A and their relationship to each other. The clk signal 310 is a waveform generated by an oscillator within the sensor IC 200, the test mode signal 305 are the test sequences generated by the ATE 280 and included in the scan vector 285. The scan enable signal 320 is included within the scan vector 285 generated by the ATE 280 and the value of the scan enable signal 320 determines the type of scan to be performed, i.e., a LOC or LOS type of scan. The LOC test signal 315 is generated by the pulse double circuit 220 using the clock signal 210 and the test mode signal 215. The SCAN_SEint signal 325 is generated by the LBIST multiplexer 245 using the LOS test signal 265 (FIG. 3A).

As demonstrated in FIG. 4, when a launch-off-shift (LOS) scan is performed, the pulse double circuit 220 still generates a LOC-type test signal 315. However, the scan enable signal 320 is lengthened to the LOS launch 350 and LOS capture 360 points in time such that more time is spent testing the circuit. A comparison of the un-shifted, LOC-based scan enable signal 320 and the shifted, LOS-based SCAN_SEint signal 325 demonstrates that the SCAN_SEint signal 325 is high longer than the scan enable signal 320 and therefore the self-test circuit 270 spends more time testing its various registers.

In some instances, the scan vector 285 can be modified to update the sequence files created by the ATE 280 by swapping the test mode signal 215 with the setting of the scan enable signal 205 when the scan enable signal 205 is low (zero). The LOC test signal 225 is removed from the test sequence because the test signal generator 230 handles providing the timing for the SCAN_SEint signal 250 and launching a double pulse that conforms to the latest shifting-capture pair.

The conversion of LOC to LOS includes an off-line software generation of an LOS sequence with which the LOC vectors are generated for the ATE 280 and the above-described sensor circuitry to generate the LOS vectors based on the LOC sequence using the pulse double circuit 220 and test signal generator 230. LOS and LOC vectors are not only different in the scan enable and scan clock sequence, but also the input and output vectors are different. This means that to exercise the sensor using LOS vectors, a LOS scan sequence must be specifically created and input and output vectors will be different from the LOC version. Since the ATE needs a LOC sequence because it cannot handle LOS timing, the previously created LOS sequence can be modified to "look like" a LOC sequence by means of the changes described in Table 1. In this way, the ATE can handle the scan sequence and stimulates the sensor as using a sequence that looks like a LOC sequence. The input and output vector sequences are calculated for a LOS sequence and won't work for actual LOC vectors. Then, this sequence is sent to the sensor, where the pulse double circuit 220 and the test signal generator 230 re-convert it into a LOS sequence again, which will exercise test circuit 270.

TABLE 1

| Sequence created by the Tool | Postprocessed sequence |
| --- | --- |
| Test Mode Signal pulse (shift clk) | Test Mode Signal pulse (shift clk) |
| Test Mode Signal pulse (shift clk) | Scan Enable = 0 |
| Scan Enable = 0 | Test Mode Signal pulse (double pump clk) |
| Test Mode Signal pulse (capture clk) | — |
| Scan Enable = 1 | Scan Enable = 1 |

A multiplexer receives the launch off shift test signal 265 and the LBIST scan enable signal 260 to generate SCAN_SEint 250 and carry out a logical built-in self-test (LBIST) of the logic test points or flip flops within the self-test circuit 270. In some instances, these logic test points, or flip flops can be referred to as internal registers, and the internal registers are connected together in a scan chain so that the output of one leads to the input of the next. Together, the scan chain constitutes the self-test circuit 270. The number of flip flops included in a typical sensor IC 200 can be within a range of 1000 to 4000 flip flops. The greater the number of flip flops, the larger the size of the IC 200. For example, an IC 200 with 4000 flip flops can be considered a large-sized part, an IC 200 with 2900 flip flops can be considered a medium-sized part, and an IC 200 with 1000 flip flops can be considered a small-sized part.

The multiplexer 245 can be used to switch between the scan enable signal 205 and the LBIST_SE signal 260 when running LBIST. The scan enable signal 205 and the LBIST_SE signal 260 can be substantially the same signal, however the LBIST_SE signal 260 can be based on scan logic. The scan enable signal 205 is generated by the ATE 280 and therefore uses externally created scan vectors. The LBIST_SE signal 260 is used to re-order the flip flops 271 in the self-test circuit 270 so that they function as shift registers. This signal 260 or stimulus is generated using build in test logic rather than external vectors. When running LBIST, a signature, or compressed version of an output vector, is generated rather than an output vector. This signature can be used to check whether a similar signature is generated by a different device when tested at the same time.

Data is fed through the scan chain of the self-test circuit 270 and the value returned by the registers of the self-test circuit 270 are compared to an expected result generated by the ATE 280 when the ATE 280 generates the test sequences used to test the sensor IC 200. When the result generated by the elements of the self-test circuit 270 fails to match the expected results generated by the ATE 280, the mismatch may indicate a defect in the sensor IC 200.

The expected results are a binary sequence that is generated using a simulation that executes LOC-based test sequences. Both the test sequences and the expected results are included in the scan vector 285. Since the original sequence is a LOS test sequence, the input vector and expected output vector are not modified. The only thing modified is the scan_enable and scan clock sequence to make the LOS sequence look like a LOC sequence.

Figure 3C:
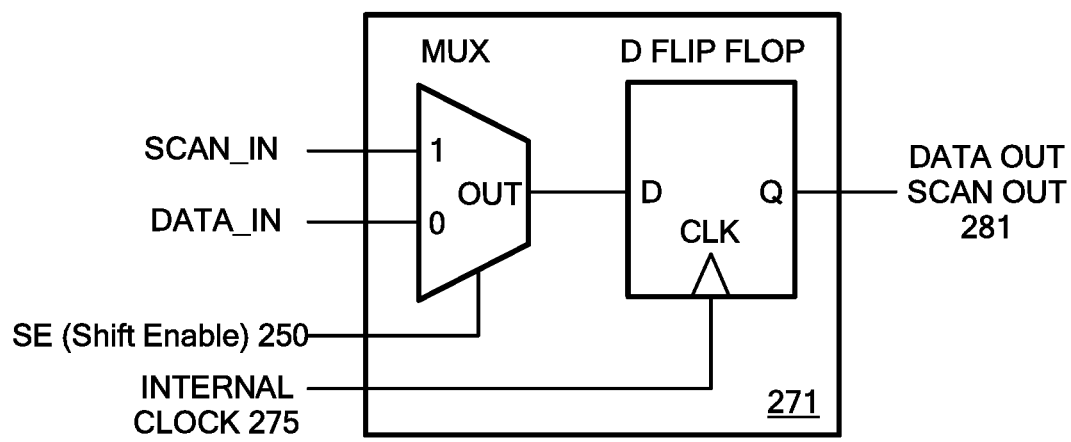

Illustrated in FIGS. 3B and 3C are aspects of a self-test circuit 270. This self-test circuit 270 can include multiple flip flops 271a-d that receive a primary input 250 and an internal clock 275. Digital logic 273 is used to determine the operation of the flip flops 271a-d and feedback 281 is generated. The flip flops 271a-d are filled with aspects of the SCAN vector 285 and in this particular implementation, modified aspects of the SCAN vector 285, i.e., the SCAN_SEint signal 250, that approximate a launch off shift scan. When the scan enable 205 signal is low, the flip flops 271a-d are placed in a test mode such that the digital logic 273 can be tested with the next clock pulse thereby creating a feedback signal 281. The scan enable signal 205 is then set high and the feedback 281 is compared against an expected output vector generated by the ATE 280.

FIG. 3C illustrates flip flops 271 within the self-test circuit 270. These flip flops 271 receive the internal clock signal 275, which can be generated by the pulse double circuit 220 and can be the same as the clock signal 210. The flip flops 271 also receive the SCAN_SEint signal 250 which is used to enable a scan. After performing a scan, data is outputted 281 in the form of feedback.

Testing the sensor IC 200 using a LOS methodology requires less time than the amount of time required to test the sensor IC 200 using a LOC methodology. Reducing the amount of time required to test each sensor IC 200 increases the number of sensor ICs 200 that can be tested in a finite period of time and therefore reduces the cost associated with IC testing.

Tables 2, 3 and 4 include experimental data that demonstrates the difference between the test coverage, number of required test vectors and test time for LOC and the test coverage, number of required test vectors and test time for LOS for large, medium and small ICs. A large part has approximately 4000 flip flops and Table 2 illustrates that LOS testing for this size part has a wider coverage, requires less test vectors and takes less time to perform a test. A medium part has approximately 2900 flip flops and Table 3 illustrates that LOS testing for this size part takes less time and on average requires less test vectors and provides more dynamic coverage. A small part has approximately 1000 flip flops and Table 4 illustrates that LOS testing for this size part takes less time and on average requires less test vectors and provides more dynamic coverage. Based on this experimental data, the average total vector reduction is approximately 51.64%.

TABLE 2

| | Large Part | | |
|---|---|---|---|
| Result | Launch off capture | Launch off shift | Difference |
| Dynamic coverage [%] | 90.74 | 95.34 | +4.60% |
| Dynamic vectors [-] | 8362 | 3202 | -61.70% |
| Static coverage [%] | 99.55 | 99.57 | -0.02% |
| Static vectors [-] | 270 | 186 | -31.11% |
| IDDq coverage [%] | 99.89 | 99.87 | -0.02% |
| IDDq vectors [-] | 334 | 330 | -1.19% |
| Total vectors | 8967 | 3719 | -58.52% |
| Compute run time | 3 h 42 m | 1 h 50 m | -50.45% |

TABLE 3

| | Medium Part | | |
|---|---|---|---|
| Result | Launch off capture | Launch off shift | Difference |
| Dynamic coverage [%] | 90.53 | 93.24 | +2.71% |
| Dynamic vectors [-] | 3065 | 886 | -70.09% |
| Static coverage [%] | 99.62 | 99.62 | +0.00% |
| Static vectors [-] | 150 | 185 | +23.33% |
| IDDq coverage [%] | 99.01 | 99.01 | +0.0% |
| IDDq vectors [-] | 241 | 241 | +0.0% |
| Total vectors | 3457 | 1313 | -62.01% |
| Compute run time | 2 h 01 m | 0 h 26 m | -78.51% |

TABLE 4

| | Small Part | | |
|---|---|---|---|
| Result | Launch off capture | Launch off shift | Difference |
| Dynamic coverage [%] | 84.99 | 93.37 | +8.38% |
| Dynamic vectors [-] | 1522 | 873 | -42.64% |
| Static coverage [%] | 99.06 | 99.10 | +0.04% |
| Static vectors [-] | 157 | 163 | +3.82% |
| IDDq coverage [%] | 98.82 | 98.82 | +0.00% |
| IDDq vectors [-] | 190 | 190 | +0.00% |
| Total vectors | 1869 | 1226 | -34.40% |
| Compute run time | 1 h 56 m | 0 h 45 m | -61.20% |

It should be appreciated that the circuit architectures and methods described herein are merely embodiments of the fault test circuit, and that aspects of the fault test circuit can be modified while maintaining the function of the fault test circuit. All publications and references cited herein are expressly incorporated by reference in their entirety.

The invention claimed is:

1. An integrated circuit sensor comprising:
    a test program generator configured to receive a portion of a scan vector comprising a test mode signal and a scan enable signal, and the test program generator configured to retrieve a launch-off-capture test sequence from the scan vector and generate a launch-off-capture test signal using the launch-off-capture test sequence and the test mode signal;
    a test clock signal generator configured to generate a launch-off-shift test signal using the launch-off-capture test signal and the scan enable signal;
    a built-in self-test circuit configured to test the integrated circuit sensor using the launch-off-shift test signal; and
    an oscillator configured to generate a master clock signal.

2. The integrated circuit sensor of claim 1 wherein the test program generator is configured to generate a launch-off-capture test signal using the launch-off-capture test sequence, the test mode signal and the master clock signal.

3. The integrated circuit sensor of claim 1 wherein the test program generator receives the scan vector from external test equipment.

4. The integrated circuit sensor of claim 3 wherein the scan vector comprises one or more test sequences and one or more expected test results.

5. The integrated circuit sensor of claim 1 wherein the test clock signal generator is configured to receive the scan vector.

6. The integrated circuit sensor of claim 1 wherein the test clock signal generator comprises a flip flop and an OR gate.

7. The integrated circuit sensor of claim 6 wherein the OR gate is configured to shift the launch-off-capture test signal to generate the launch-off-shift test signal.

8. A method for testing an integrated circuit sensor comprising:
receiving a scan vector comprising a test mode signal, a scan enable signal and a launch-off-capture test sequence;
generating a launch-off-capture test signal using the test mode signal, the launch-off-capture test sequence, and a master clock signal;
generating a launch-off-shift test signal using the launch-off-capture test signal and the scan enable signal; and
testing the integrated circuit sensor using the launch-off-shift test signal.

9. The method of claim 8 wherein receiving the scan vector comprises receiving the scan vector from external test equipment.

10. The method of claim 8 comprising:
receiving test results generated by a digital core of the integrated circuit sensor responsive to the launch-off-shift test signal, wherein the test results are associated with a launch-off-shift test mode.

11. An integrated circuit sensor comprising:
means for receiving a scan vector comprising a test mode signal, a scan enable signal and a launch-off-capture test sequence;
means for generating a launch-off-capture test signal using the test mode signal, the launch-off-capture test sequence, and a master clock signal;
means for generating a launch-off-shift test signal using the launch-off-capture test signal and the scan enable signal; and
means testing the integrated circuit sensor using the launch-off-shift test signal.

12. The integrated circuit of claim 11 wherein means for receiving the scan vector comprises means for receiving the scan vector from external test equipment.

13. The integrated circuit of claim 11 comprising:
means for receiving test results generated by a digital core of the integrated circuit sensor responsive to the launch-off-shift test signal, wherein the test results are associated with a launch-off-shift test mode.

14. An integrated circuit sensor comprising:
a test program generator configured to receive a portion of a scan vector comprising a test mode signal and a scan enable signal, and the test program generator configured to retrieve a launch-off-capture test sequence from the scan vector and generate a launch-off-capture test signal using the launch-off-capture test sequence and the test mode signal;
a test clock signal generator configured to generate a launch-off-shift test signal using the launch-off-capture test signal and the scan enable signal, wherein the test clock signal generator comprises a flip flop and an OR gate; and
a built-in self-test circuit configured to test the integrated circuit sensor using the launch-off-shift test signal.

15. The integrated circuit sensor of claim 14 comprising an oscillator configured to generate a master clock signal.

16. The integrated circuit sensor of claim 15 wherein the test program generator is configured to generate a launch-off-capture test signal using the launch-off-capture test sequence, the test mode signal and the master clock signal.

17. The integrated circuit sensor of claim 14 wherein the test program generator receives the scan vector from external test equipment.

18. The integrated circuit sensor of claim 17 wherein the scan vector comprises one or more test sequences and one or more expected test results.

19. The integrated circuit sensor of claim 14 wherein the test clock signal generator is configured to receive the scan vector.

20. The integrated circuit sensor of claim 14 wherein the OR gate is configured to shift the launch-off-capture test signal to generate the launch-off-shift test signal.

21. A method for testing an integrated circuit sensor comprising:
receiving a scan vector comprising a test mode signal, a scan enable signal and a launch-off-capture test sequence;
generating a launch-off-capture test signal using the test mode signal and the launch-off-capture test sequence;
generating a launch-off-shift test signal using the launch-off-capture test signal and the scan enable signal;
testing the integrated circuit sensor using the launch-off-shift test signal; and
receiving test results generated by a digital core of the integrated circuit sensor responsive to the launch-off-shift test signal, wherein the test results are associated with a launch-off-shift test mode.

22. The method of claim 21 wherein generating the launch-off-capture test signal further comprises generating the launch-off-capture test signal using the test mode signal, the launch-off-capture test sequence and a master clock signal.

23. The method of claim 21 wherein receiving the scan vector comprises receiving the scan vector from external test equipment.

* * * * *

UNITED STATES PATENT AND TRADEMARK OFFICE
CERTIFICATE OF CORRECTION

| | | |
|---|---|---|
| PATENT NO. | : 11,016,145 B1 | Page 1 of 1 |
| APPLICATION NO. | : 16/720531 | |
| DATED | : May 25, 2021 | |
| INVENTOR(S) | : Ignacio Lesser et al. | |

It is certified that error appears in the above-identified patent and that said Letters Patent is hereby corrected as shown below:

In the Specification

Column 1, Line 6 delete "Integrated. Circuit" and replace with --Integrated Circuit--.

Column 1, Line 19 delete "(INT)" and replace with --(DFT)--.

Column 1, Line 27 delete "INT" and replace with --DFT--.

Column 2, Line 61 delete "DUT" and replace with --DUTs--.

Column 3, Line 2 delete "DUT 14$a$." and replace with --DUTs 14$a$-14$n$--.

Column 5, Line 53 delete "205 signal" and replace with --signal 205--.

Column 7, Line 61 delete "an LOS" and replace with --a LOS--.

Column 8, Line 52 delete "build in" and replace with --built-in--.

Column 9, Lines 26-27 delete "data is outputted 281" and replace with --data 281 is output--.

Column 11, Line 37 delete "means testing" and replace with --means for testing--.

Signed and Sealed this
Twenty-fourth Day of May, 2022

Katherine Kelly Vidal
*Director of the United States Patent and Trademark Office*